(12) United States Patent
Porterfield

(10) Patent No.: US 6,588,001 B1
(45) Date of Patent: Jul. 1, 2003

(54) METHOD FOR INSERTING REPEATER CELLS IN A DEEP SUB-MICRON DESIGN

(75) Inventor: A. Kent Porterfield, New Brighton, MN (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 09/651,996

(22) Filed: Aug. 31, 2000

(51) Int. Cl.⁷ .................................................. G06F 9/45
(52) U.S. Cl. .................. 716/8; 716/9; 716/10; 716/11
(58) Field of Search ................. 716/1, 2, 6, 7–11, 716/15, 17, 18; 714/726; 703/16, 23

(56) References Cited

U.S. PATENT DOCUMENTS 5,801,958 A * 9/1998 Dangelo et al. ............... 716/18
5,838,580 A    11/1998 Srivatsa
6,009,253 A    12/1999 Srivatsa et al.

* cited by examiner

Primary Examiner—Vuthe Siek
Assistant Examiner—Naum Levin
(74) Attorney, Agent, or Firm—Dickstein Shapiro Morin & Oshinsky LLP (57) ABSTRACT

A method is provided in which repeater cells are automatically inserted within a sub-micron design before the physical design of the die has been started. The method automatically inserts a predetermined number of repeater cells within the interconnect lines that couple functional blocks on a semiconductor die. In a preferred embodiment, the repeater cell insertion is carried out during the logical design stage by adding a series of commands within a commercially available synthesis tool. A placement tool optimizes the physical placement of the repeater cells within the die.

26 Claims, 8 Drawing Sheets

METHOD FOR INSERTING REPEATER CELLS IN A DEEP SUB-MICRON DESIGN

BACKGROUND OF THE INVENTION

1. Field of the Invention

The present invention relates to the field of integrated circuits. More particularly, it relates to a method for automatically inserting repeater cells between functional blocks of a sub-micron design.

2. Description of the Related Art

The number of logic gates used in a deep sub-micron design is extraordinary compared to designs of just a few years ago. In today's chip designs, logic gates are grouped within functional blocks. There may be hundreds of thousands of logic gates within each functional block, and there may be many functional blocks that make up a single die.

There are a number of design tools that lay out a logic design onto a die. These tools are generally known as "floorplanning tools." A floorplanning tool attempts to find the best placement of all the logic cells of a design, keeping the cells that communicate with one another close to each other. In this manner, the floorplanning tools form blocks of logic called functional blocks. These functional blocks make up the highest level of logical hierarchy on the die.

Experience has shown that for large designs, it is advantageous to floorplan the large functional blocks onto specific areas of the die through the use of fences. Fences keep all the logic cells of a particular functional block together in the same general area, as depicted in FIG. 1.

Figure 1:
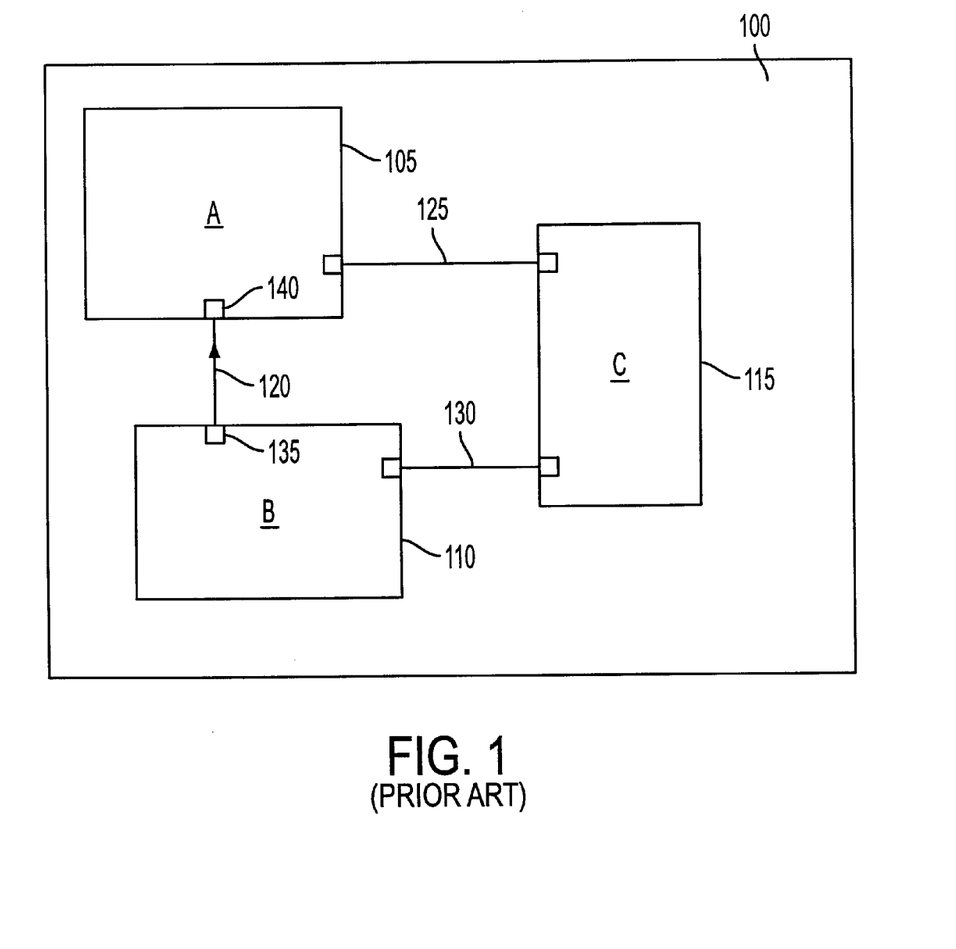
FIG. 1 illustrates a block diagram of functional blocks on a semiconductor die.

FIG. 1 shows a die 100 that contains three functional blocks A, B, and C. Each of the functional blocks A, B, C, is contained within a respective fence 105, 110, 115. Fencing prevents cells from a particular functional block from being scattered across the die, and will generate the best timing results within the fenced regions.

Floorplanning the large functional blocks A, B, C, solves many of the timing delay problems in a design, however, it also tends to worsen delays incurred in the interconnects 120, 125, 130 between the functional blocks A, B, C. Each of the functional blocks A, B, C communicate with each other on the die through control signals, etc. Therefore, interconnects 120, 125, 130 are required between the functional blocks A, B, C.

The interconnects (e.g., wires, traces, etc.) 120, 125, 130 may need to be long, traversing many microns across the die. In sub-micron designs, long interconnects traversing across the die will incur a substantial delay due to large RC (i.e., resistance×capacitance) values that impede a signal travelling from a source 135 to a destination 140. These delays affect the maximum speed at which the entire chip may operate.

Figure 2:
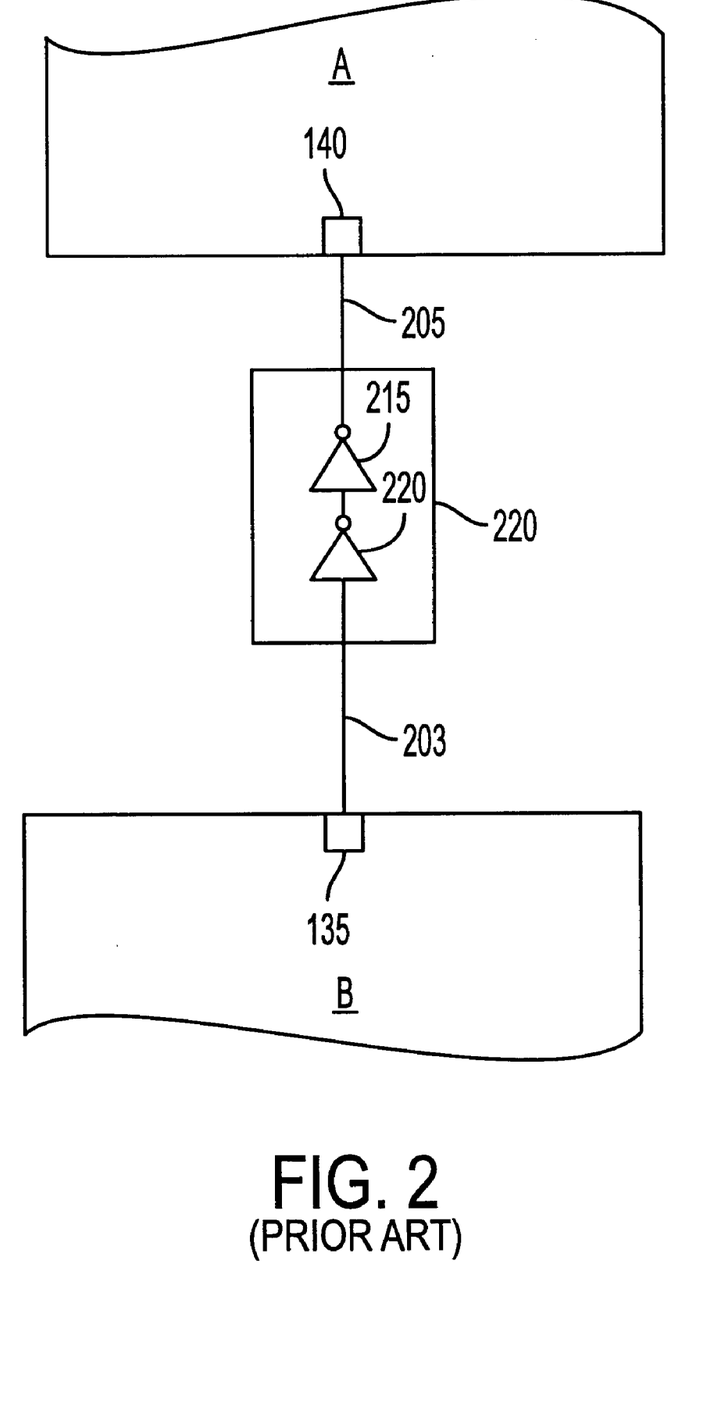
FIG. 2 illustrates a conventional repeater cell between two functional blocks.

Turning to FIG. 2, it is known that inserting a repeater cell 200 within a length of interconnect (e.g., 120 of FIG. 1) is advantageous to break up the long interconnect length, such that the source 135 drives a length of interconnect 203 and the repeater cell 200 drives a length of interconnect 205. Repeater cell 200 allows a signal to propagate faster because long wires incur non-linear delays. The repeater cell 200 serves to boost the signal strength, allowing a signal to traverse larger distances with less propagation delay. One known repeater 200 configuration is two consecutive inverters 220, 215. Repeater 200 first inverts the control signal, then inverts it again to arrive at the original signal; however, the original signal is refreshed by the repeater 200.

Due to the very large number of inputs/outputs (I/Os) (e.g., 135, 140) between the functional blocks A, B, C in an actual die, manually inserting the repeater cells 200 (e.g., during the physical layout stage of manufacturing the die 100) is very time consuming and prone to human error. One method for inserting repeaters 200 within long interconnect lines 120 is disclosed in U.S. Pat. No. 5,838,580 to Srivatsa. The Srivatsa method, however, requires that the physical design (in addition to the logical design) of the die be known to the designer so that the optimum number of repeaters, type of repeaters and location of each repeater may be calculated and incorporated within the physical design of the die just prior to actually physically manufacturing the die.

During the manufacturing process, there is a logical design stage and then a physical design stage. During the logical design stage, the synthesis tool converts a high-level design language (HDL) into a logical configuration while optimizing the logical interconnections required to effectuate the intended purpose(s). This conversion process is known as "synthesizing" the HDL. The floorplanning tool then groups the logic gates within functional blocks A, B, C, as described above in connection with FIG. 1. In addition, the floorplanning tool optimizes the interconnection of the functional blocks A, B, C and, in fact, after synthesis, the logical representation (as opposed to the actual physical design) of the interconnects 120, 125, 130 between the functional blocks do exist.

During the physical design stage, however, the results of the floorplanning tool (i.e., the logical design) are implemented by a placement tool (e.g., Avanti or any other such placement tool known to one skilled in the art, etc.) in order to optimize the physical layout of the logic gates, functional blocks A, B, C and interconnects 120, 125, 130 on the die 100. It is only after this point that the Srivatsa method can be implemented. That is, the Srivatsa method requires that a series of complex calculations be carried out where the calculations require knowledge of the physical parameters of the circuit layout. While the Srivatsa method is effective, it is overly complicated, requires many levels of calculations and generally provides a degree of accuracy not always required by the designer.

For many designs, a simplified, automated process for inserting a predetermined number of repeaters 200 within a given length of interconnect 120 would suffice. Ideally, the insertion process could be implemented with and carried out by a design tool familiar to sub-micron circuit designers. Thus, there exists a desire and need for a simplified method for automatically inserting repeater cells within sub-micron circuit designs.

SUMMARY OF THE INVENTION

The present invention overcomes the problems associated with the prior art and provides a simplified method for automatically inserting repeater cells within sub-micron designs. In accordance with an exemplary embodiment of the invention, a method is provided in which repeater cells are automatically inserted within a sub-micron design before the physical design of the die has been started. The method automatically inserts a predetermined number of repeater cells within the interconnect lines that couple functional blocks on a semiconductor die. In a preferred embodiment, the repeater cell insertion is carried out during the logical design stage by adding a series of commands within a commercially available synthesis tool. A placement tool optimizes the physical placement of the repeater cells within the die.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described as set forth in exemplary embodiments illustrated in FIGS. 3–9. Other embodiments may be realized and other changes may be made to the disclosed embodiments without departing from the spirit or scope of the present invention.

Figure 3:
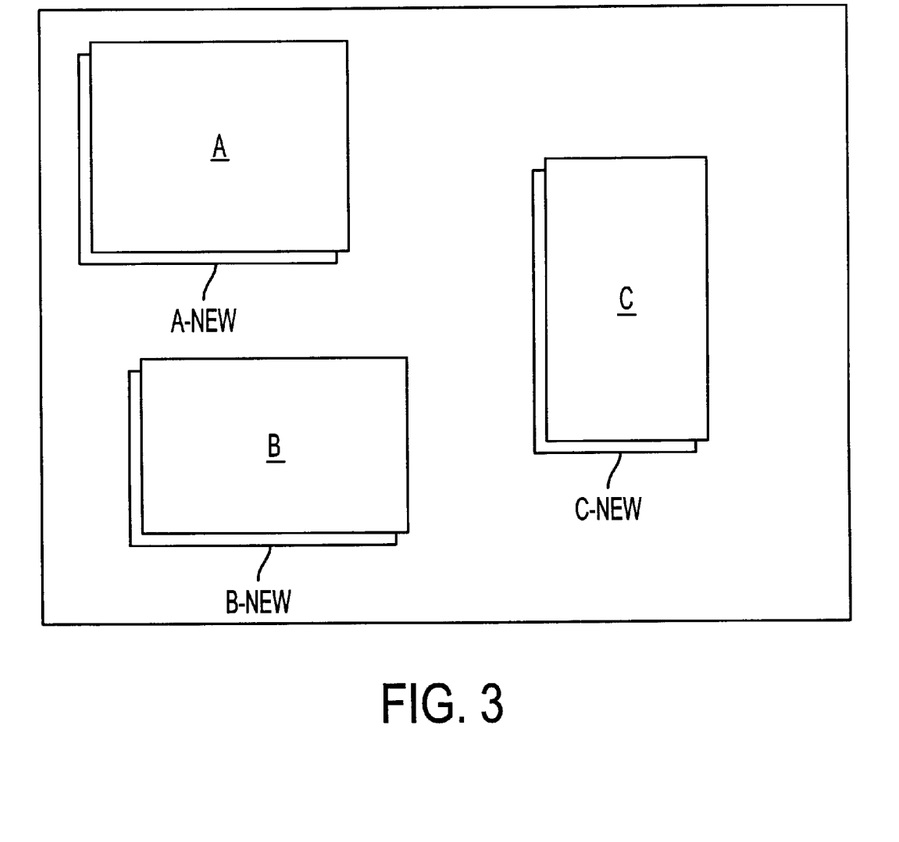
FIG. 3 illustrates a block diagram of a new level of logical hierarchy in accordance with an exemplary embodiment of the invention.

FIG. 3 illustratively depicts a block diagram of a new logical level of hierarchy just below the highest logical level of hierarchy. As described above, the functional blocks A, B, C represent the highest logical level. In accordance with an exemplary embodiment of the invention, a new level of hierarchy is added for each respective functional block A, B, C. The new levels of hierarchy A-NEW, B-NEW, C-NEW are inserted just below the functional block level.

For example, for functional block A, a new logical level of hierarchy is inserted just below the functional block level, the new level being named A-NEW. Similarly, for functional blocks B and C, a new level of logical hierarchy is inserted just below the functional block level; these logical levels are respectively called B-NEW and C-NEW. These new levels of logical hierarchy A-NEW, B-NEW and C-NEW are placed by the floorplanning tool within the fenced regions 105, 110, 115 of the functional blocks A, B, C. The purpose for creating the new level of logical hierarchy will be described in connection with FIGS. 4–8.

Figure 4:
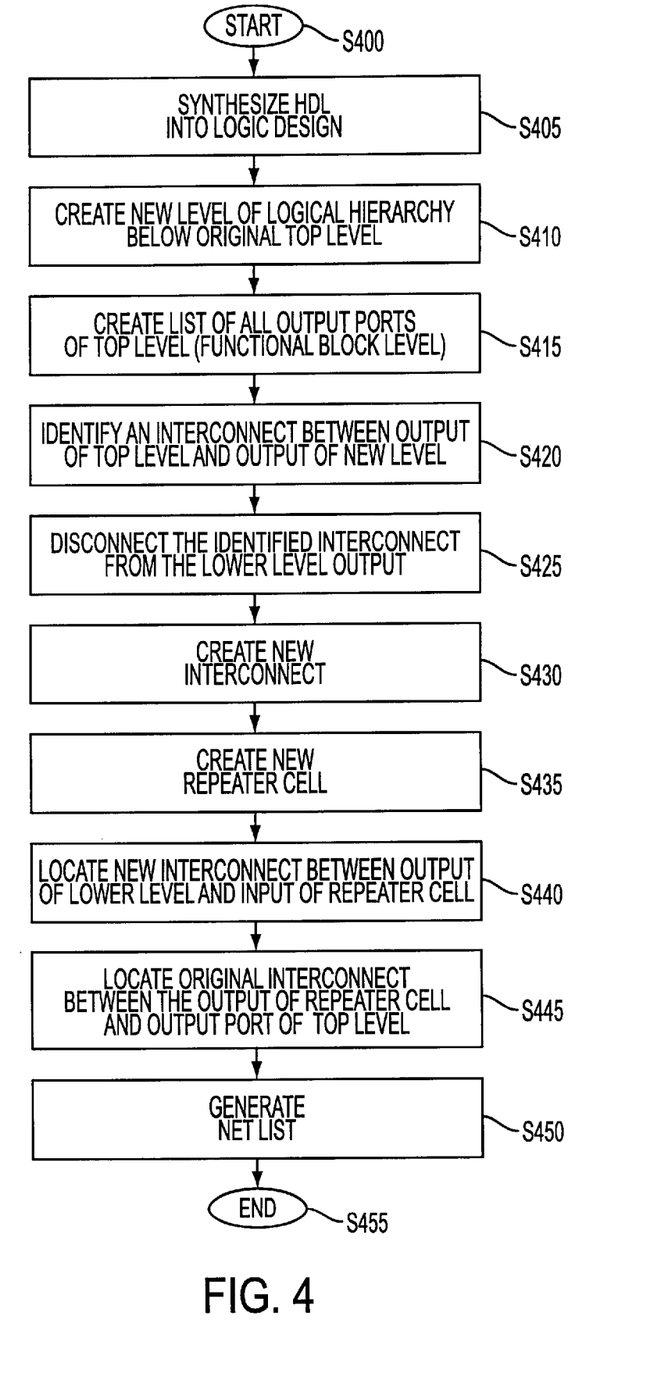
FIG. 4 illustrates an operational flow of the method in accordance with a first exemplary embodiment of the invention.

Turning now to FIG. 4, an operational flow of the method for automatically inserting repeater cells is depicted in accordance with a first exemplary embodiment of the invention. At portion S400, the process begins. At portion S405, the process synthesizes a high level design language (HDL) into a logical design including a plurality of logic gates and circuits. In addition to synthesizing HDL into a logical design, the major functions performed on the die are grouped into functional blocks (e.g., A, B, C of FIG. 1). As described above, all logic gates associated with a functional block are located within the respective fences 105, 110, 115 of each functional block. The functional blocks A, B, C represent the highest level of logical hierarchy in the design. That is, at this highest level of hierarchy, all of the logic within a functional block is defined as one functional block (e.g., A) interconnected with another functional block (e.g., B) on the die 100. Below each highest level of logical hierarchy A, B, C are respective subordinate levels of the logical hierarchy. These subordinate levels of the logical hierarchy include actual gate configurations and interconnections, and at an even lower level of the logical hierarchy the actual component configuration for each gate is defined. It should be noted that, at step 405, as a result of the synthesis process, not only do the functional blocks A, B and C exist but, in addition, the interconnections 120, 125, 130 for logically interconnecting the functional blocks on the die exist.

At portion S410, a new level of the logical hierarchy (e.g., B-NEW) is created just below the original top level of the logical hierarchy (e.g., B). At portion S415, a list of all output ports of the original top level (e.g., B) is created. At portion S415, output port 135 and any other output ports of functional block B are identified and added to the list.

At portion S420, a logical interconnect (e.g., 605 of FIG. 6) between the output of the original top level of the logical hierarchy (i.e., the output port 135 of functional block B) and an output of the new subordinate level of the logical hierarchy created at portion S410 are identified. Interconnect 605 is depicted as coupling the output port 135 of original top level B and output port 600 of the new level of hierarchy B-NEW.

At portion S425, interconnect 605 is disconnected from the lower level output port 600. At portion S430, a new interconnect 265 (of FIG. 7) is created and a repeater cell (e.g., 200 of FIG. 7) is created at portion S435. At portion S440, the new interconnect 265 is located between the output port 600 of the lower level B-NEW and the input to the repeater cell 200 (see FIG. 7). At portion S445, interconnect 605 is coupled between the output of the repeater cell 200 and the output port 135 of the top level. At portion S450, a net list is generated. The net list, as known in the art, is essentially a data base representing how the devices are interconnected on the chip. That is, the net list does not necessarily specify where on the chip the devices exist, just the fact that they exist on the chip. At portion S455, the method ends and a predetermined number of repeater cells (here, only one pair) is inserted within the logical design of the sub-micron circuit.

Once the predetermined number of repeater cells 200 has been inserted within the logical design of the sub-micron circuit, the sub-micron circuit is now ready for the physical design stage. As described above, the results of the floorplanning tool are implemented by a placement tool, however, in accordance with an embodiment of the invention, the results of the floorplanning tool also include the repeater cells 200 that have been automatically inserted within the logical design. Just as the placement tool optimizes the physical layout of other components on the die, the placement tool automatically locates the predetermined number of repeater cells 200 in an optimal location on the interconnect coupling the functional blocks A, B, C. It may be determined by the placement tool that the optimal location for the repeater cells 200 are either inside or outside of the functional blocks A, B, C, or wherever else appropriate.

For example, the placement tool may determine the optimal location for at least one repeater cell 200 is within a fenced region of a functional block B if the source or destination, or both, lies deep within the fenced region of the functional blocks (e.g., B, A). In accordance with an embodiment of the invention, once the repeater cell 200 has been added to the logical design of the sub-micron circuit, the physical location is automatically carried out by the placement tool.

Figure 5:
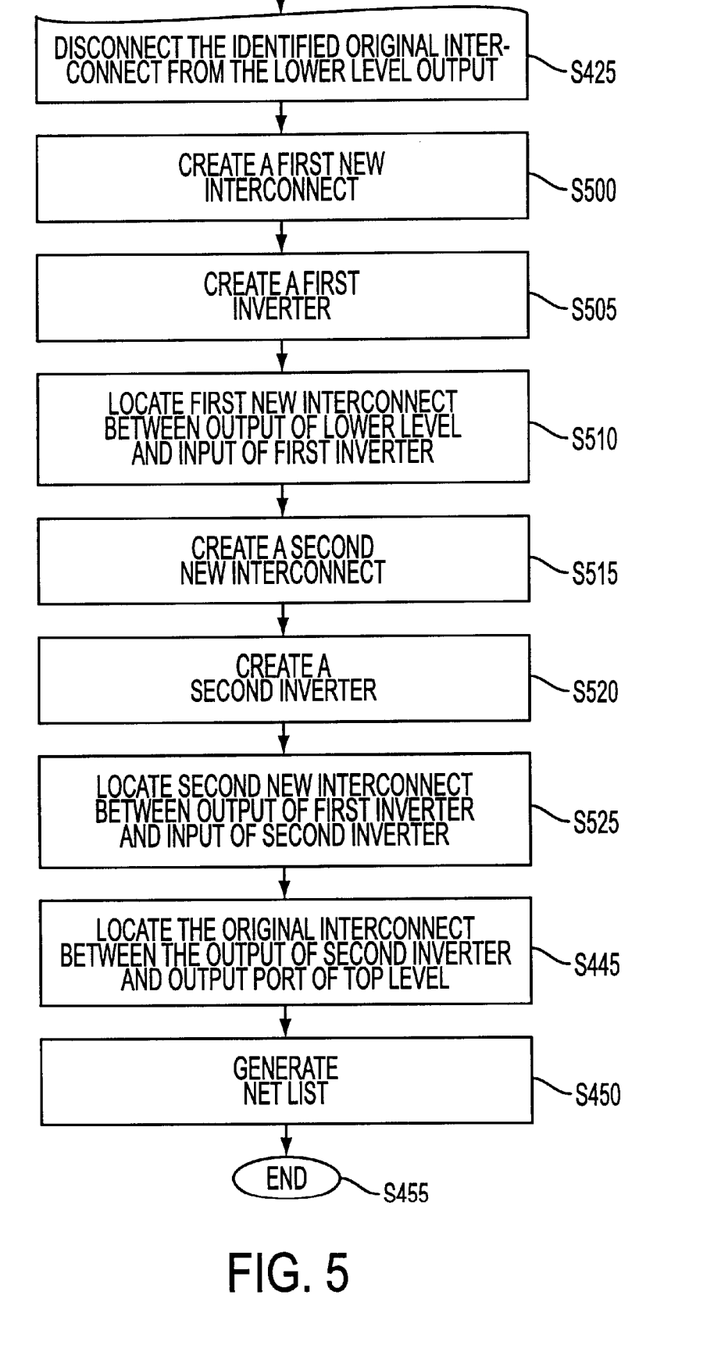
FIG. 5 illustrates an operational flow of the method in accordance with another exemplary embodiment of the invention.
Figure 6:
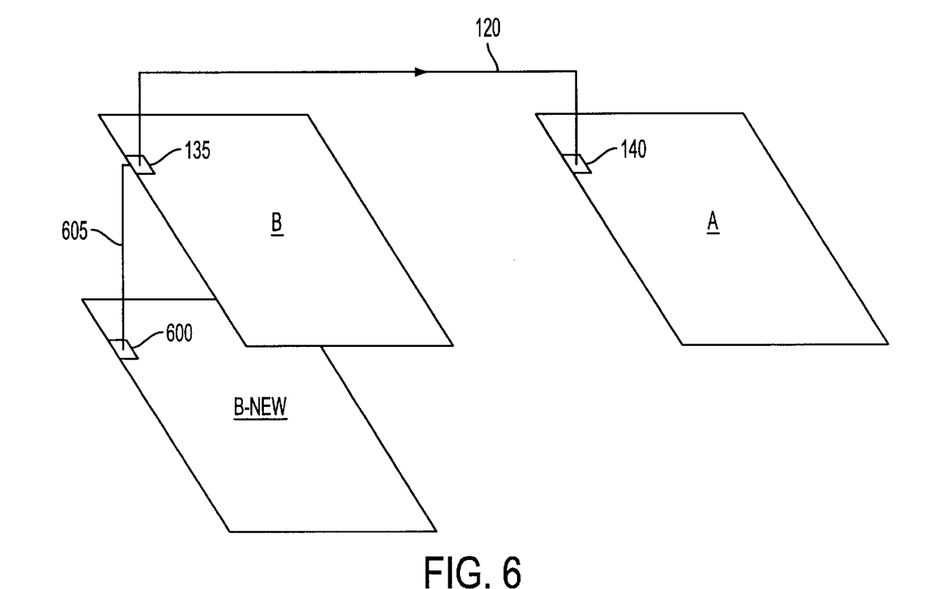
FIG. 6 illustrates a block diagram of interconnected levels of logical hierarchy in accordance with an exemplary embodiment of the invention.
Figure 7:
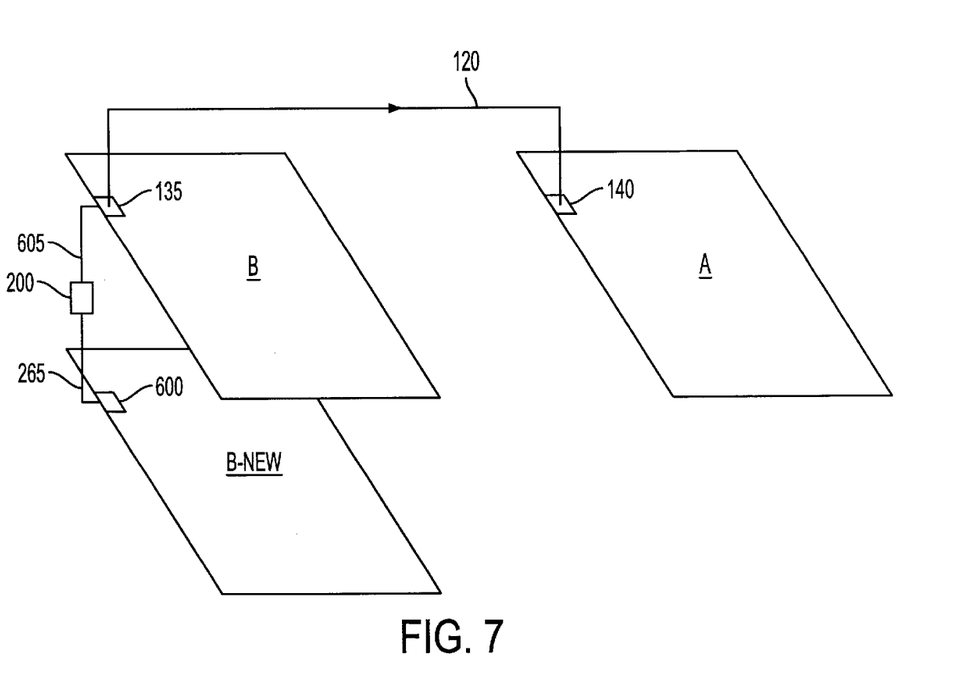
FIG. 7 illustrates the FIG. 6 block diagram having a repeater cell within an interconnect in accordance with the first exemplary embodiment of the invention.
Figure 8:
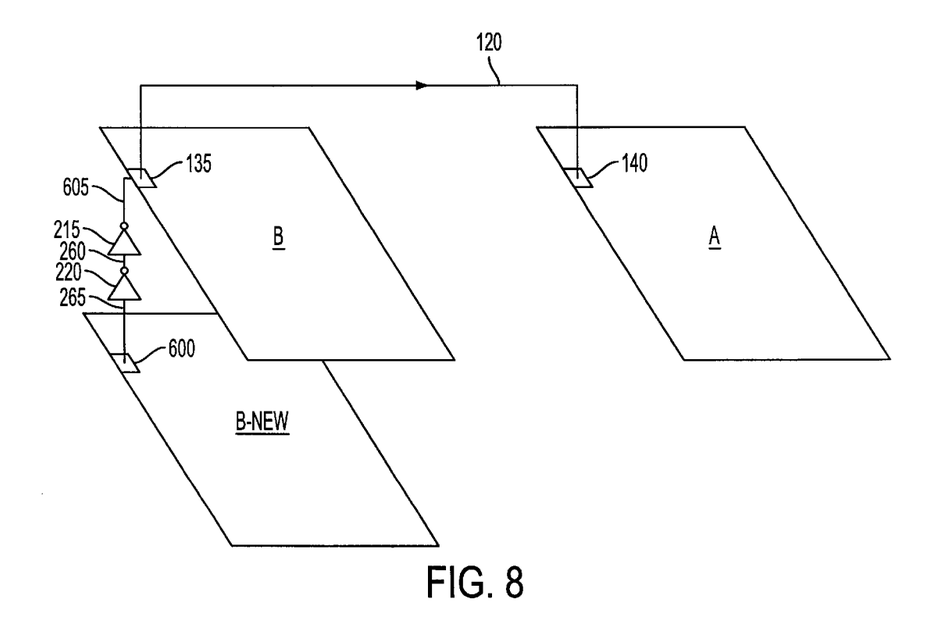
FIG. 8 illustrates the FIG. 6 block diagram having a repeater cell within an interconnect in accordance with the second exemplary embodiment of the invention.

Turning now to FIG. 5, an alternative embodiment of the operational flow described in FIG. 4 is depicted. Portions S400–S425 are identical to that of FIG. 4. At portion S500, a first new interconnect 265 is created and at portion S505 a first inverter 220 (of FIG. 8) is created. At portion S510, the first new interconnect 265 is located between the output port 600 of the lower level B-NEW and the input of the first inverter 220. At portion S515, a second new interconnect 260 is created and at portion S520 a second inverter 215 is created. At portion S525, the second new interconnect 260 is located between an output of inverter 220 and an input of inverter 215. Portion S445 is identical to portion S445 of FIG. 4. That is, the original interconnect 605 is connected between the output port 135 of the top level B and the output of inverter 215. Portions S450 and S455 are identical to those like-numbered portions of FIG. 4.

Figure 9:
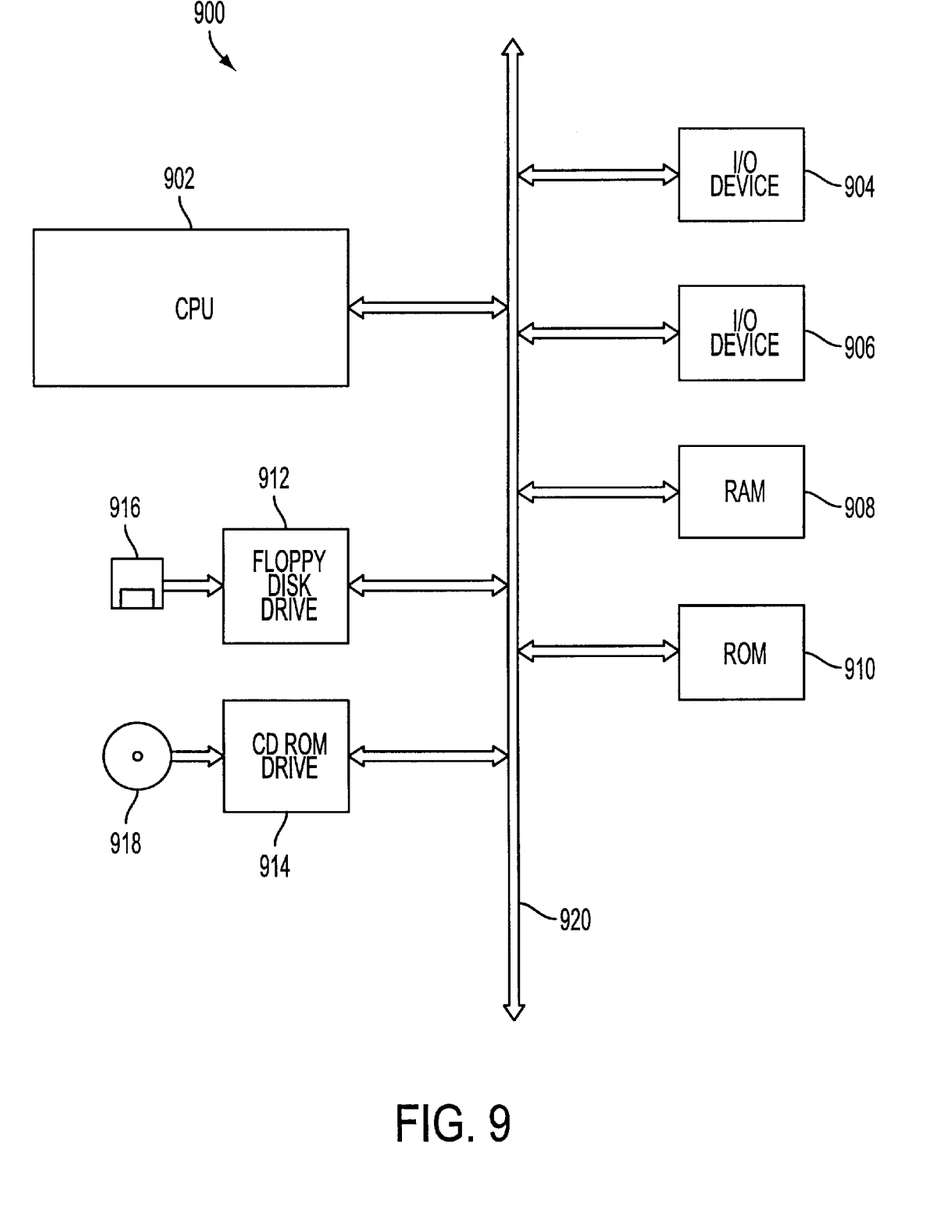
FIG. 9 depicts a block diagram of a processor-based system running a program having an operational flow in accordance with an exemplary embodiment of the invention.

An exemplary script containing commands generally found in commercially available synthesis software programs (e.g., "Synopsis") is depicted below.

embodiment of the invention. The processor-based system 900 may be a computer system or any other processor system. The system 900 includes a central processing unit (CPU) 902, e.g., a microprocessor, that communicates with floppy disk drive 912 and CD ROM drive 914 over a bus 920. It must be noted that the bus 920 may be a series of buses and bridges commonly used in a processor-based system, but for convenience purposes only, the bus 920 has been illustrated as a single bus. An input/output (I/O) device (e.g., monitor) 904, 906 may also be connected to the bus 920 for practicing the invention. The processor-based system 900 also includes a read-only memory (ROM) 910 which may also be used to store the software program.

Although the FIG. 9 block diagram depicts only one CPU 902, the FIG. 9 system could also be configured as a parallel processor machine for performing parallel processing. As known in the art, parallel processor machines can be classified as single instruction/multiple data (SIMD), meaning all processors execute the same instructions at the same time, or multiple instruction/multiple data (MIMD), meaning each processor executes different instructions. In accordance with an exemplary embodiment of the invention, at least one of the parallel processors is coupled to a bus (e.g., 920) for receiving instructions from a software program consistent with that described in connection with FIGS. 3–9.

The present invention provides a method in which repeater cells are automatically inserted within a sub-micron design before the physical design of the die has started. In

```
samagp_lib
read GM.db
samagp_scr
design_name = B
repeater_inv = library + "/INRBX3V2"
repeater_inp = "/A"
repeater_outp = "/Z"
repeater_exclude = { }
repeater_exclude = find(port, BGBW_*)
group find(cell) -design_name design_name + "-NEW" -cell_name design_name + "0"
foreach(port_name, all_outputs( ) - repeater_exclude){
    net_name=find (net, all_connected(find(port, port_name)))
    pin_name=find(pin, all_connected(find(net, net_name)))
    disconnect_net find(net, net_name) -all
    inv1 = inv1_ + port_name
    inv2 = inv2_ + port_name
    create_cell inv1 repeater_inv
    create_cell inv2 repeater_inv
    create_net inv1
    create_net inv2
    connect_net find(net, inv1)      {find(pin, pin name)             find(pin, inv1 + repeater_inp)}
    connect_net find(net, inv2)      {find(pin, inv1 + repeater_outp) find(pin, inv2 + repeater_inp)}
    connect_net find(net, net_name)  {find(pin, inv2 + repeater_outp) find(port, port_name)}
```

The specific commands are known to those of ordinary skill in the art; however, the order with which they are presented and the process which they implement are those described in connection with FIGS. 4 and 5. Since the specific commands and high level language are familiar to those having ordinary skill in the art, no further discussion of the operation of the script will be included herein.

FIG. 9 illustrates a block diagram of a processor-based system 900 configured to run a software program consistent with that described in connection with FIGS. 3–8. For example, the process described in FIG. 4 may be part of a software program stored on a computer readable medium (e.g., floppy disk 916, compact disk (CD) 918, etc.) which, when read by the system 900, operates the system to carry out the FIG. 4 process in accordance with an exemplary order to achieve this, the method automatically inserts an additional level of the logical hierarchy into the logic design. It then interconnects an output of this new logical level to the output of the original highest level (i.e., the functional block level). In doing so, the invention automatically inserts a predetermined number of repeaters within the logical interconnect line between functional blocks. The invention ensures that these repeaters are included within the logical design of the die. The repeaters are physically located on the die with the help of a placement tool known in the art. The advantages of the present invention include its simplicity for automatically inserting repeater cells within a logic design before the actual physical design of the die is known.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although only one repeater cell is depicted as being inserted within the interconnect between functional blocks, any predetermined number of repeater cells may be so added. In addition, although the repeater cells are depicted as being added to the outputs of the functional blocks, repeater cells may be added to the inputs of the functional blocks or to both inputs and outputs of the functional blocks. In addition, the invention may be used in connection with the design of application specific integrated circuits (ASICs) and field programmable gate arrays (FPGAs) with equally good results. Furthermore, while the invention is depicted as modifying the dc script of the commercially available software program, "Synopsis," any similar design tool may be modified in a similar manner including, but not limited to, Ambit, Cadence Tool, Simplicity and any other similar tool known in the art. Accordingly, the invention is not to be seen as limited by the foregoing description but is only limited by the scope of the appended claims.

What is claimed as new and desired to be protected by Letters Patent of the United States is:

1. A method for automatically inserting repeater cells, the method comprising:
   operating a processing device to create a logic design to be incorporated onto a die the logic design including a plurality of levels of logical hierarchy, a first level of said logical hierarchy being made up of at least first and second functional blocks, wherein a logical representation of at least a first interconnect couples said first and second functional blocks;
   operating said processing device to create a new level of logical hierarchy, said new level of logical hierarchy being subordinate to said first level; and
   operating said processing device to automatically insert a logical representation of at least one repeater cell between an output port of said new level and an output port of said first functional block, such that said output port of said first functional block is coupled to both said logical representation of said at least one repeater cell and said logical representation of said first interconnect.

2. The method of claim 1, wherein said act of operating a processing device to create comprises operating a processing device to synthesize a high level design language into a logical configuration.

3. The method of claim 2 further comprising deciding where on said first interconnect to insert said at least one repeater cell.

4. A method for automatically inserting repeater cells, the method comprising:
   operating a processing device to create a logic design to be incorporated onto a die, the logic design including a plurality of levels of logical hierarchy, a first level of said logical hierarchy being made up of at least first and second functional blocks, wherein a logical representation of at least a first interconnect couples said first and second functional blocks; and
   operating said processing device to create a new level of logical hierarchy, said new level being subordinate to said first level; and
   operating said processing device to automatically insert a logical representation of at least one repeater cell between an input port of said new level and an input port of said first functional block, such that said input port of said first functional block is coupled to both said logical representation of said at least one repeater cell and said logical representation of said at least one interconnect.

5. The method of claim 1, wherein said act of operating a processing device to insert further comprises:
   operating said processing device to identify a second interconnect, said second interconnect coupling said output port of said first functional block and said output port of the new level;
   operating said processing device to disconnect said second logical interconnect from said output port of the new level; and
   operating said processing device to insert said logical representation of said at least one repeater cell between said output port of the new level and the second logical interconnect.

6. The method of claim 5, wherein said act of operating said processing device to insert comprises operating said processing device to insert two consecutive inverters between said output port of the new level and the second logical interconnect.

7. The method of claim 4, wherein said act of operating said processing device to insert further comprises:
   operating said processing device to identify a second interconnect, said second interconnect coupling said input port of said first functional block and said input port of the new level;
   operating said processing device to disconnect said second logical interconnect from said input port of the new level; and
   operating said processing device to insert said logical representation of said at least one repeater cell between said input port of the new level and the second logical interconnect.

8. The method of claim 7, wherein said act of operating said processing device to insert comprises operating said processing device to insert two consecutive inverters between said input port of the new level and the second logical interconnect.

9. A method for automatically inserting repeater cells, the method comprising:
   modifying an existing die creating synthesis program to implement a process, the process comprising the acts of:
      creating a logic design to be incorporated onto a die, the logic design including a plurality of levels of logical hierarchy, a first level of said logical hierarchy being made up of at least first and second functional blocks, wherein a logical representation of at least a first interconnect couples said first and second functional blocks;
      creating a new level of logical hierarchy, said new level of logical hierarchy being subordinate to said first level; and
      automatically inserting a logical representation of at least one repeater cell between an output port of said new level and an output port of said first functional block, such that said output port of said first functional block is coupled to both said logical representation of said at least one repeater cell and said logical representation of said first interconnect.

10. A computer readable storage medium storing a computer readable program or automatically inserting repeater cells, the program being configured to operate a computer to:

create a logic design to be incorporated onto a die, the logic design including a plurality of levels of logical hierarchy, a first level of said logical hierarchy being made up of at least first and second functional blocks, wherein a logical representation of at least a first interconnect couples said first and second functional blocks;

create a new level of logical hierarchy, said new level of logical hierarchy being subordinate to said first level; and automatically insert a logical representation of at least one repeater cell between an output port of said new level and an output port of said first functional block, such that said output port of said first functional block is coupled to both said logical representation of said at least one repeater cell and said logical representation of said first interconnect.

11. The computer readable storage medium of claim 10, wherein said program is configured to operate said computer to synthesize a high level design language into a logical configuration.

12. The computer readable storage medium of claim 11, wherein said program is further configured to operate said computer to decide where on said first interconnect to insert said at least one repeater cell.

13. A computer readable storage medium storing a computer readable program for automatically inserting repeater cells, the program being configured to operate a computer to:

create a logic design to be incorporated onto a die, the logic design including a plurality of levels of logical hierarchy, a first level of said logical hierarchy being made up of at least first and second functional blocks, wherein a logical representation of at least a first interconnect couples said first and second functional blocks;

create a new level in said logical hierarchy, said new level being subordinate to said first level; and automatically insert said logical representation of said at least one repeater cell between an input port of said new level and an input port of said first functional block, such that said input port of said first functional block is coupled to both said logical representation of said at least one repeater cell and said logical representation of said at least one interconnect.

14. The computer readable storage medium of claim 10, wherein said program is further configured to operate said computer to:

identify a second interconnect, said second interconnect coupling said output port of said first functional block and said output port of the new level;

disconnect said second logical interconnect from said output port of the new level; and insert said logical representation of said at least one repeater cell between said output port of the new level and the second logical interconnect.

15. The computer readable storage medium of claim 14, wherein said program is further configured to operate said computer to insert two consecutive inverters between said output port of the new level and the second logical interconnect.

16. The computer readable storage medium of claim 13, wherein said program is further configured to operate said computer to:

identify a second interconnect, said second interconnect coupling said input port of said first functional block and said input port of the new level;

disconnect said second logical interconnect from said input port of the new level; and insert said logical representation of said at least one repeater cell between said input port of the new level and the second logical interconnect.

17. The computer readable storage medium of claim 16, wherein said program is further configured to operate said computer to insert two consecutive inverters between said input port of the new level and the second logical interconnect.

18. A processor system, comprising:

at least one processor; and a storage medium coupled to said at least one processor, said storage medium storing a processor readable program for automatically inserting repeater cells, said at least one processor being responsive to said program to:

create a logic design to be incorporated onto a die, the logic design including a plurality of levels of logical hierarchy, a first level of said logical hierarchy being made up of at least first and second functional blocks, wherein a logical representation of at least a first interconnect couples said first and second functional blocks;

create a new level of logical hierarchy, said new level of logical hierarchy being subordinate to said first level; and automatically insert a logical representation of at least one repeater cell between an output port of said new level and an output port of said first functional block, such that said output port of said first functional block is coupled to both said logical representation of said at least one repeater cell and said logical representation of said first interconnect.

19. The processor system of 18, wherein said program is configured to operate said computer to synthesize a high level design language into a logical configuration.

20. The processor system of claim 19, wherein said program is further configured to operate said computer to decide where on said first interconnect to insert said at least one repeater cell.

21. A processor system, comprising:

at least one processor; and a storage medium coupled to said at least one processor, said storage medium storing a processor readable program for automatically inserting repeater cells, said at least one processor being responsive to said program to:

create a logic design to be incorporated onto a die, the logic design including a plurality of levels of logical hierarchy, a first level of said logical hierarchy being made up of at least first and second functional blocks, wherein a logical representation of at least a first interconnect couples said first and second functional blocks;

create a new level in said logical hierarchy, said new level being subordinate to said first level; and automatically insert a logical representation of at least one repeater cell between an input port of said new level and an input port of said first functional block, such that said input port of said first functional block is coupled to both said logical representation of said at least one repeater cell and said logical representation of said at least one interconnect.

22. The processor system of claim 18, wherein said program is further configured to operate said computer to:
   identify a second interconnect, said second interconnect coupling said output port of said first functional block and said output port of the new level;
   disconnect said second logical interconnect from said output port of the new level; and
   insert said logical representation of said at least one repeater cell between said output port of the new level and the second logical interconnect.

23. The processor system of claim 22, wherein said program is further configured to operate said computer to insert two consecutive inverters between said output port of the new level and the second logical interconnect.

24. The processor system of claim 21, wherein said program is further configured to operate said computer to:
   identify a second interconnect, said second interconnect coupling said input port of said first functional block and said input port of the new level;
   disconnect said second logical interconnect from said input port of the new level; and
   insert said logical representation of said at least one repeater cell between said input port of the new level and the second logical interconnect.

25. The processor system of claim 21, wherein said program is further configured to operate said computer to insert two consecutive inverters between said input port of the new level and the second logical interconnect.

26. The processor system of claim 18, wherein said processor system is a parallel processor system.

\* \* \* \* \*

UNITED STATES PATENT AND TRADEMARK OFFICE
CERTIFICATE OF CORRECTION

PATENT NO. : 6,588,001 B1
DATED : July 1, 2003
INVENTOR(S) : A. Kent Porterfield It is certified that error appears in the above-identified patent and that said Letters Patent is hereby corrected as shown below:

<u>Column 25,</u>
Change "21" to -- 24 --.

Signed and Sealed this

Eighth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,588,001 B1
DATED : July 1, 2003
INVENTOR(S) : A. Kent Porterfield

It is certified that error appears in the above-identified patent and that said Letters Patent is hereby corrected as shown below:

Column 12,
Line 11, change "21" to -- 24 --.

This certificate supersedes Certificate of Correction issued June 8, 2004.

Signed and Sealed this

Twenty-ninth Day of March, 2005

JON W. DUDAS
*Director of the United States Patent and Trademark Office*